(12) United States Patent
Oniyama et al.

(10) Patent No.: US 8,860,454 B2
(45) Date of Patent: Oct. 14, 2014

(54) CONNECTOR AND SEMICONDUCTOR TESTING DEVICE INCLUDING THE CONNECTOR

(75) Inventors: Kyoko Oniyama, Lisle, IL (US);
Akinori Mizumura, Lisle, IL (US);
Shin Sakiyama, Chiyoda-ku (JP);
Hiroyuki Hama, Chiyoda-ku (JP);
Hiromitsu Takasu, Chiyoda-ku (JP)

(73) Assignees: Advantest Corporation, Tokyo (JP);
Molex Japan Co., Ltd., Yamato (JP)

( * ) Notice: Subject to any disclaimer, the term of this patent is extended or adjusted under 35 U.S.C. 154(b) by 208 days.

(21) Appl. No.: 13/378,009

(22) PCT Filed: Jun. 30, 2010

(86) PCT No.: PCT/US2010/040538
§ 371 (c)(1),
(2), (4) Date: Feb. 6, 2012

(87) PCT Pub. No.: WO2011/002848
PCT Pub. Date: Jan. 6, 2011

(65) Prior Publication Data
US 2012/0126845 A1    May 24, 2012

(30) Foreign Application Priority Data
Jun. 30, 2009    (JP) ................. 2009-156361

(51) Int. Cl.
*G01R 31/26* (2014.01)
*H01R 13/20* (2006.01)
*H01R 107/00* (2006.01)
*G01R 1/04* (2006.01)
*H01R 24/60* (2011.01)
*H01R 31/06* (2006.01)

(52) U.S. Cl.
CPC ............ *H01R 13/20* (2013.01); *H01R 2107/00* (2013.01); *G01R 1/0416* (2013.01); *H01R 2201/20* (2013.01); *H01R 24/60* (2013.01); *H01R 31/06* (2013.01)
USPC .................................................... 324/762.01

(58) Field of Classification Search
CPC ............................. G01R 1/0416; H01R 13/20
USPC ................. 324/762.01–762.1, 754.01–754.3; 439/260, 108, 657
See application file for complete search history.

(56) References Cited

U.S. PATENT DOCUMENTS

| | | | |
|---|---|---|---|
| 3,744,005 A | 7/1973 | Sitzler | |
| 5,026,292 A * | 6/1991 | Pickles et al. | 439/108 |

(Continued)

FOREIGN PATENT DOCUMENTS

| | | |
|---|---|---|
| GB | 1 463 515 A | 2/1977 |
| JP | 3677594 | 10/2001 |

OTHER PUBLICATIONS

International Search Report for PCT/US2010/040538.

*Primary Examiner* — Tung X Nguyen
(74) *Attorney, Agent, or Firm* — Timothy M. Morella

(57) ABSTRACT

A connector includes a first terminal. The first terminal includes a movable portion, and the movable portion has, on its tip side, a contact portion located on a course C of a case assembly. Further, the first terminal includes a fixed portion restricted from moving and located on a base side of the movable portion. The movable portion is elastically deformable to incline toward a side surface of an insertion hole while using the fixed portion as a fixed point. Further, the movable portion includes a hit portion between the contact portion and the fixed portion. The hit portion is located apart from the side surface of the insertion hole, and the hit portion is provided capable of hitting, midway during inclining of the movable portion toward the side surface of the insertion hole, against the side surface of the insertion hole.

3 Claims, 13 Drawing Sheets

(56) References Cited

U.S. PATENT DOCUMENTS

| | | | |
|---|---|---|---|
| 5,035,631 A * | 7/1991 | Piorunneck et al. | 439/108 |
| 5,104,329 A * | 4/1992 | Brown et al. | 439/108 |
| 7,422,493 B2 | 9/2008 | Wang et al. | |

\* cited by examiner

CONNECTOR AND SEMICONDUCTOR TESTING DEVICE INCLUDING THE CONNECTOR

FIELD OF THE INVENTION

The present invention relates to a connector including a plate spring-shaped terminal, and to a semiconductor testing device including the connector. In particular, the present invention relates to technology for reducing force required at the time of inserting an electronic component into the connector, and of securing sufficient force to press the terminals onto conductors formed in the electronic component.

BACKGROUND OF THE INVENTION

Heretofore, a connector including plate spring-shaped terminals has been used. The connector disclosed in Patent Document 1 includes: a housing having an insertion hole formed therein, into which an electronic component (for example, a circuit board, terminal of cable, and the like) for connecting with the connector can be inserted; and a terminal inserted into the insertion hole. The terminal is formed into a plate-spring shape elongated in a direction in which the electronic component is inserted. The terminal includes, on its tip side, a contact portion located on a course through which the electronic component passes at the time of its insertion. In an insertion process of the electronic component, the tip portion of the electronic component pushes the contact portion, and consequently, the terminal is elastically deformed such that the contact portion retreats from the course of the electronic component.

In the insertion process of the electronic component, when the tip of the electronic component is inserted by a required distance while pushing the contact portion, a reaction force (force in an opposite direction to the insertion direction, which is mainly caused by elastic force of the terminal and frictional force between the terminal and the electronic component) resulting from the elastic force of the terminal is generated. Therefore, it is necessary to press the electronic component into the connector with a force (hereinafter, insertion force) exceeding the reaction force. Then, after the electronic component is pressed into the connector, and the tip of the electronic component passes by the contact portion, the contact portion is pressed onto a conductor, which is formed on a surface of the electronic component, by the elastic force of the terminal.

SUMMARY OF THE INVENTION

However, in the conventional connector described above, it has been difficult to secure sufficient force (hereinafter, contact force) to press the contact portion onto the conductor of the electronic component while reducing the insertion force for inserting the electronic component. Specifically, when the elastic force of the terminal is decreased in order to reduce the insertion force required for inserting the electronic component, the contact force is also decreased and, as a result, bad electrical contact is likely to be caused between the contact portion of the connector and the conductor of the electronic component. Meanwhile, when the elastic force of the terminal is increased, the force of reaction resulting from the elastic force is also increased, and as a result, the required insertion force is also increased.

The present invention has been made in consideration of the foregoing problems. It is an object of the present invention to provide a connector capable of securing sufficient contact force while reducing the insertion force required in the insertion process of the electronic component, and to provide a semiconductor testing device including the connector.

In order to solve the above-mentioned problems, a connector according to the present invention, includes: a terminal formed into a plate spring shape and arranged to extend in an insertion direction of an electronic component to be connected to the connector; and a housing having an insertion hole formed therein, the insertion hole being formed such that the electronic component can be inserted into the insertion hole and accommodating the terminal. The terminal includes a movable portion and a fixed portion. The movable portion includes a contact portion on its tip side, and the contact portion is located on a course in the insertion hole, through which the electronic component passes. The movable portion extends from the contact portion toward a side surface of the insertion hole, the side surface being located apart from the course. The fixed portion is located on a base side of the movable portion and restricted from moving. The movable portion is allowed to elastically deform to incline toward the side surface of the insertion hole, employing the fixed portion as a fixed point of inclining. Further, the movable portion includes a hit portion between the contact portion and the fixed portion, the hit portion being located apart from the side surface of the insertion hole. The hit portion is provided capable of hitting, midway during inclining of the movable portion toward the side of the side surface of the insertion hole, against the side surface.

Further, a semiconductor testing device according to the present invention, includes a circuit board on which the above-mentioned connector is mounted.

In accordance with the present invention, at the beginning when the electronic component hits against the contact portion, the movable portion can be elastically deformed while using the fixed portion as the fixed point. After that, the movable portion can start to elastically deform while using the hit portion as the fixed point midway during the deformation of the movable portion. The hit portion is located between the fixed portion and the contact portion, and accordingly, the elastic force of the terminal elastically deforming while using the hit portion as the fixed point, can be greater than the elastic force of the terminal elastically deforming while using the fixed portion as the fixed point. As a result, it becomes easy to secure sufficient contact force simultaneously with reducing the insertion force required in the insertion process of the electronic component.

Further, in an aspect of the present invention, the connector may further include a second terminal formed into a plate spring shape and arranged to face the terminal across the course. The second terminal may include a second movable portion and a second fixed portion. The second movable portion may include a second contact portion on its tip side, and the second contact portion may be located on the course of the electronic component. Further, the second movable portion may extend from the second contact portion toward a side surface of the insertion hole. The second fixed portion may be located on a base side of the second movable portion and restricted from moving. Further, the contact portion and the second contact portion may have a positional difference in the insertion direction of the electronic component. In accordance with this aspect, the time when the insertion force for the terminal reaches the maximum and the time when the insertion force for the second terminal reaches the maximum can be differentiated from each other. As a result, the maximum value of the sum of the required insertion forces can be reduced.

Further, in this aspect, the second contact portion may be located at a deeper position in the insertion hole than that of the contact portion, and the contact portion and the second contact portion may respectively include guide portions, the guide portions extending in an opposite direction to the insertion direction of the electronic component and inclining to expand the interval between them. Then, the guide portion of the second contact portion may have an inclination angle with respect to the insertion direction smaller than the inclination angle of the guide portion of the contact portion with respect to the insertion direction. With this structure, the insertion force required for the second terminal can be smaller than the insertion force required for the terminal, so that the electronic component can be smoothly inserted into the connector.

Moreover, in this aspect, the second movable portion may have a second hit portion between the second contact portion and the second fixed portion, the second hit portion being located apart from the side surface of the insertion hole. The second hit portion may be provided capable hitting, midway during inclining of the second movable portion toward the side surface of the insertion hole, against the side surface of the insertion hole. In accordance with this aspect, at the beginning when the electronic component hits against the second contact portion, the second movable portion can be elastically deformed while using the second fixed portion as the fixed point. After that, the second movable portion can start to be elastically deformed while using the second hit portion as the fixed portion midway during of deformation of the second movable portion. The second hit portion is located between the second fixed portion and the second contact portion, and accordingly, the elastic force of the second terminal elastically deforming while using the second hit portion as the fixed point can be greater than the elastic force of the second terminal elastically deforming while using the second fixed portion as the fixed point. As a result, it becomes easy to sufficiently secure the contact force of the second contact portion simultaneously with reducing the insertion force required in the insertion process of the electronic component.

BRIEF DESCRIPTION OF THE DRAWINGS

In FIG. 13, a line A indicates insertion force required for the first terminal, and a line B indicates insertion force required for the second terminal. Further, a line C indicates the sum of the insertion forces indicated by the line A and the line B.

DESCRIPTION OF THE PREFERRED EMBODIMENTS

Figure 1:
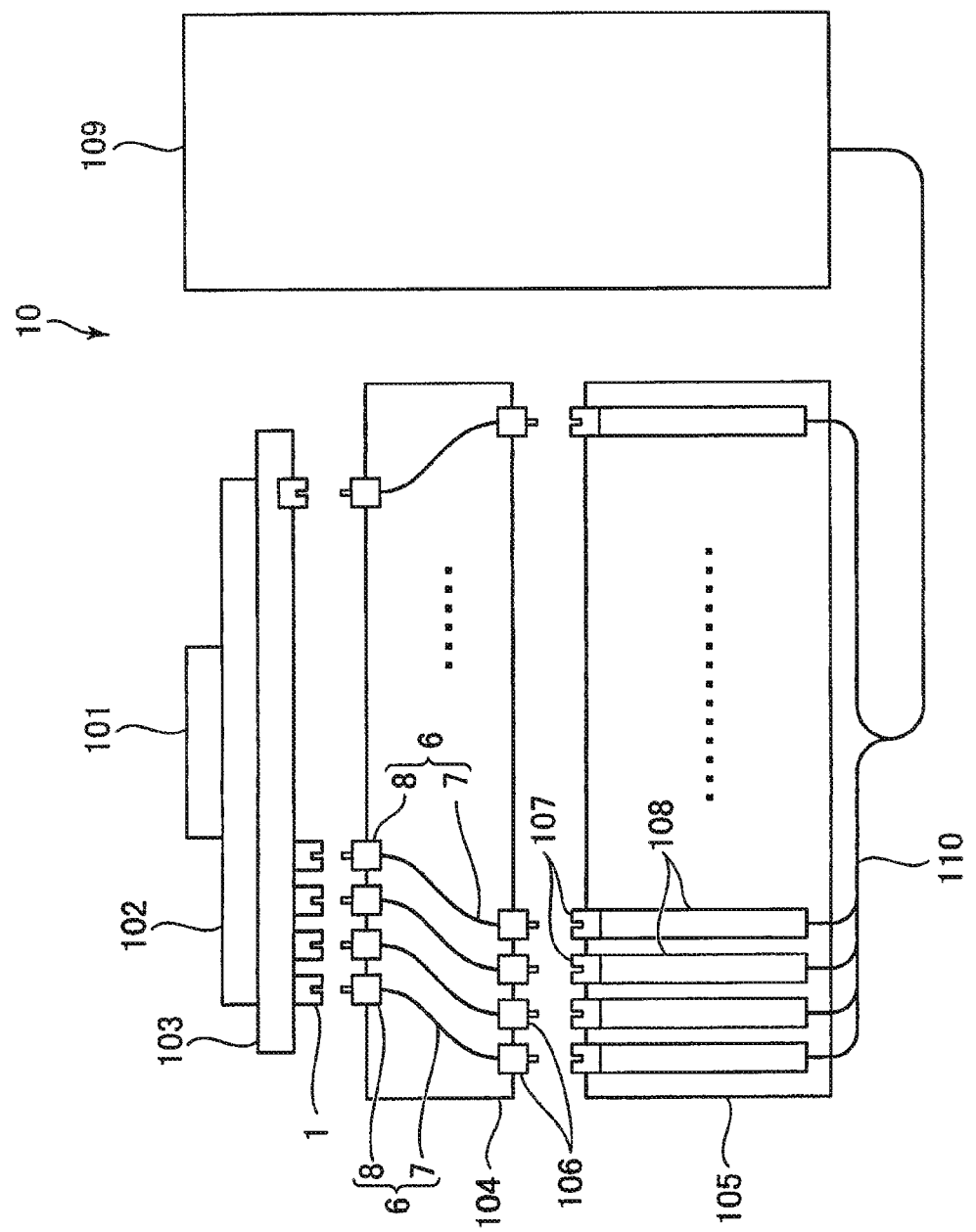
FIG. 1 is a schematic view of a semiconductor testing device including a circuit board on which a connector according to the present invention is mounted.
Figure 2:
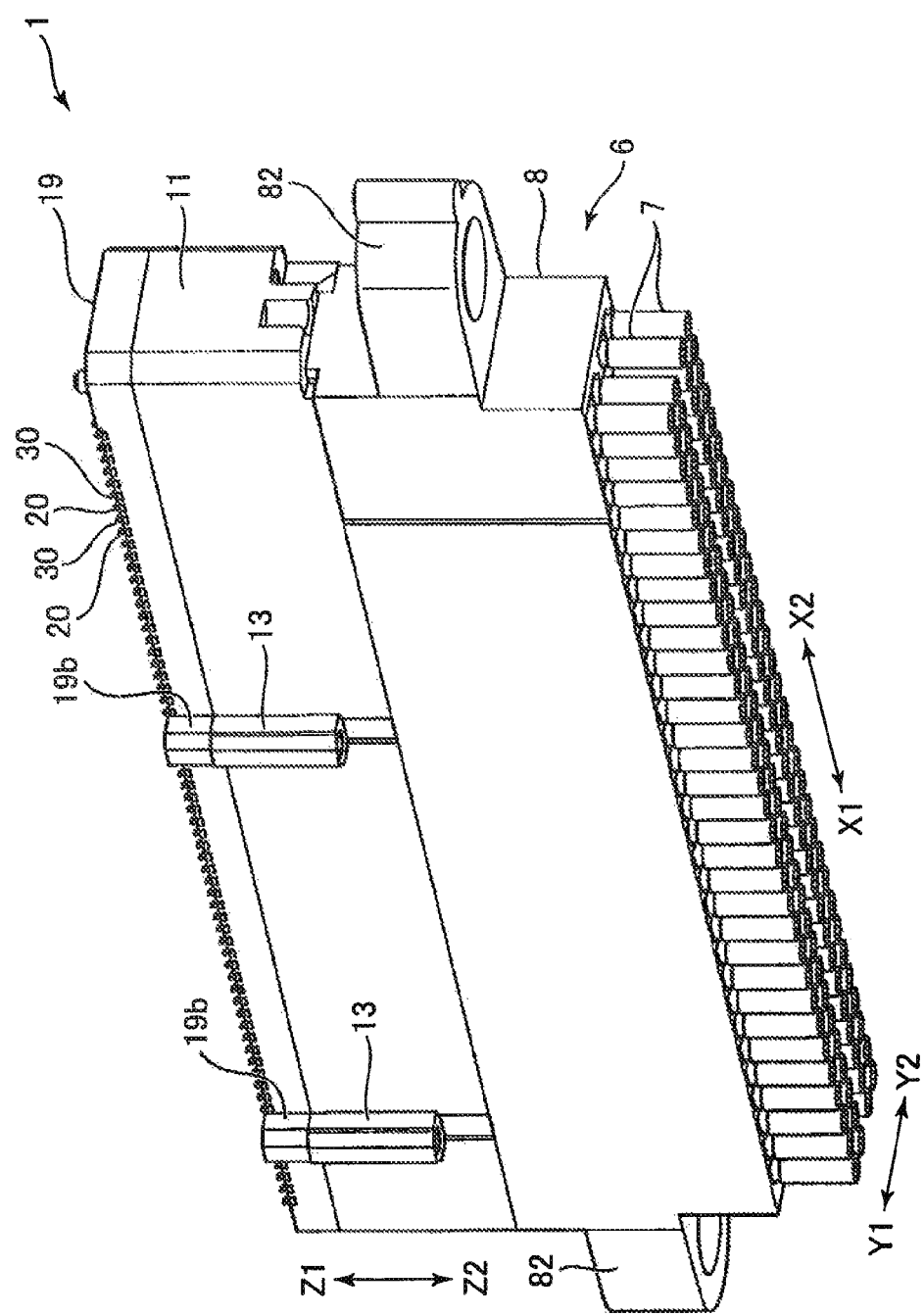
FIG. 2 is a perspective view of the connector and a cable assembly connected to the connector.
Figure 3:
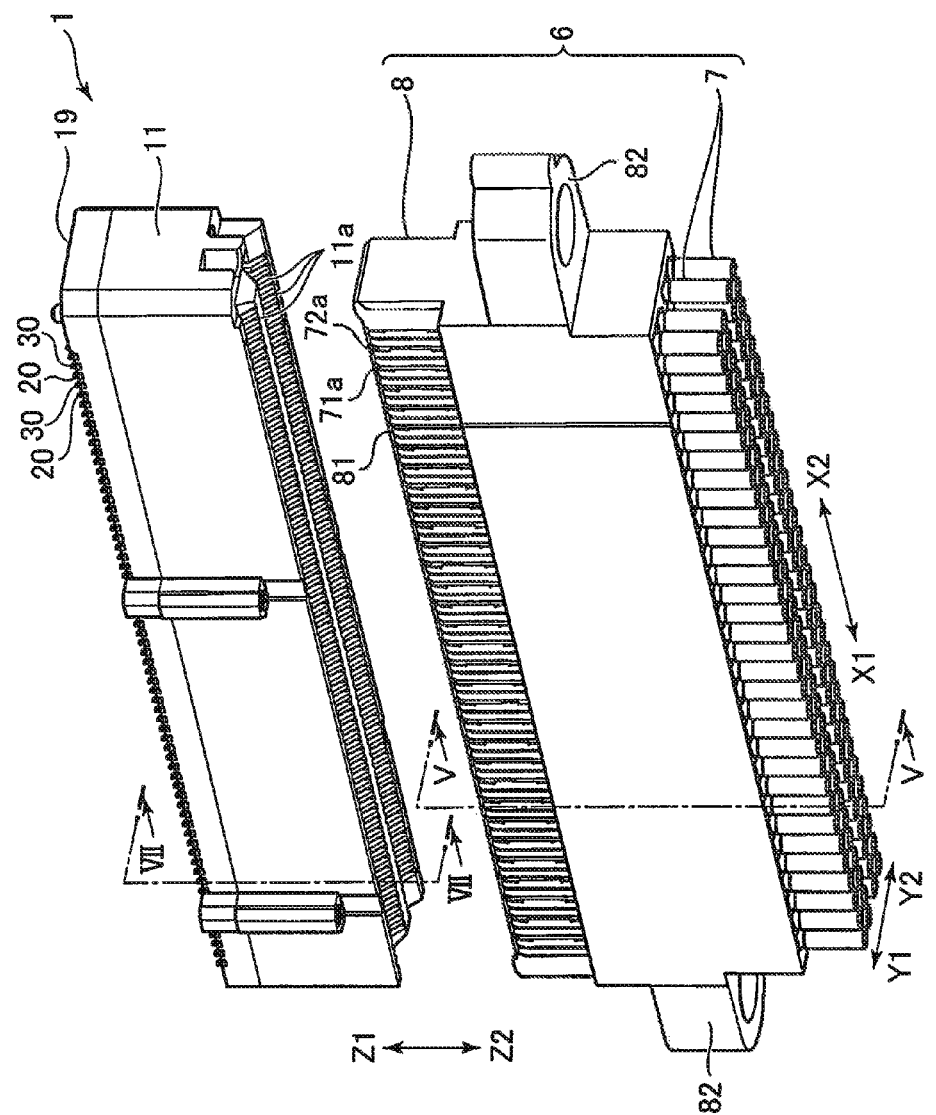
FIG. 3 is an exploded perspective view of the connector and the cable assembly.

A description will be given of an embodiment of the present invention while referring to the drawings. FIG. 1 is a schematic view of a semiconductor testing device 10 on which connectors 1 as examples of the embodiment of the present invention are mounted. FIG. 2 is a perspective view of the connector 1 and cable assembly 6 connected to the connector 1, and FIG. 3 is an exploded perspective view of the connector 1 and the cable assembly 6.

As illustrated in FIG. 1, the semiconductor testing device 10 includes: a test head 105; a motherboard 104 arranged on the test head 105; a performance board (circuit board) 103 arranged on the motherboard 104; and a device socket 102 arranged on the performance board 103. A semiconductor 101 as a test target is mounted on the device socket 102, and the semiconductor 101 is connected to the performance board 103 through the device socket 102. A plurality of the connectors 1 are mounted on a back surface of the performance board 103. The connector 1 includes a plurality of terminals 20 and 30 to be described later, and the respective terminals 20 and 30 are electrically connected to terminals of the semiconductor 101 through transmission lines formed in the performance board 103 and through terminals provided in the device socket 102. A plurality of connectors 8 are mounted on an upper surface of the motherboard 104, and a plurality of coaxial cables 7 accommodated in the motherboard 104 are connected to each of the connectors 8 (refer to FIG. 2 or FIG. 3). The plurality of connectors 8 are individually held at positions corresponding to the connectors 1 provided on the performance board 103. Therefore, the plurality of connectors 8 can be fitted at one time into the connectors 1 corresponding thereto, when the performance board 103 or the motherboard 104 is moved in a vertical direction. In this regard, each of the cable assembly 6 is constituted by the plurality of coaxial cables 7 and the connectors 8 to which the coaxial cables 7 are connected. Moreover, as illustrated in FIG. 2, each of the connectors 8 includes attachment portions 82 for fixing the connector 8 to the upper surface of the motherboard 104. The attachment portions 82 are fixed to the motherboard 104, for example, by bolts or rivets.

A plurality of connectors 106 are held on a lower surface of the motherboard 104. Lower ends of the plurality of coaxial cables 7 are connected to each of the connectors 106. On an upper surface of the test head 105, a plurality of connectors 107 connected to the connectors 106 are provided. Testing modules 108 accommodated in the test head 105 are respectively fixed to the connectors 107. The testing modules 108 are connected to a testing-device main-body 109 through a transmission line 110. The testing modules 108 generate test signals under control of the testing-device main-body 109, and the test signals are inputted to the semiconductor 101 through the coaxial cables 7, the connectors 1, the performance board 103, and the like.

Figure 4A:
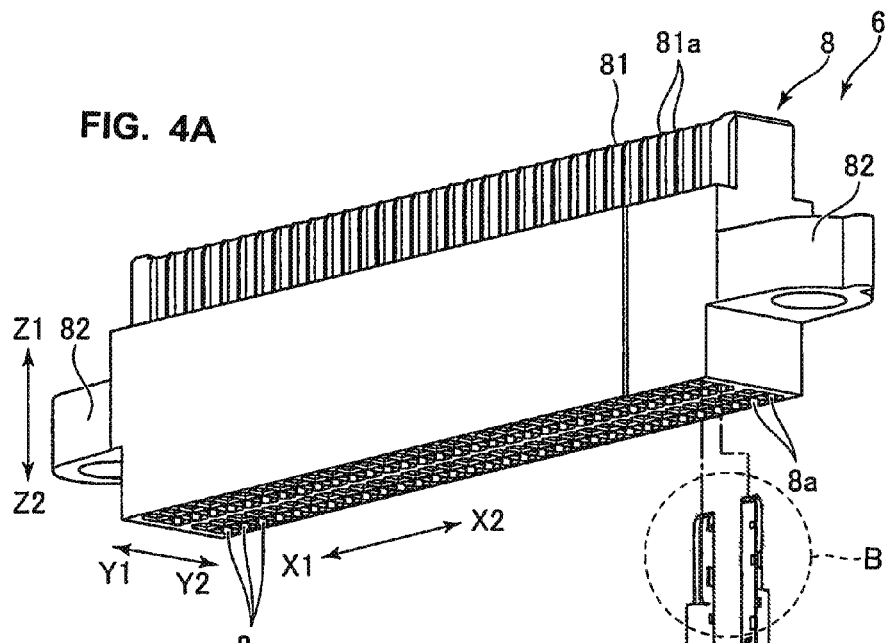
FIG. 4A is an exploded perspective view of the cable assembly.
Figure 4B:
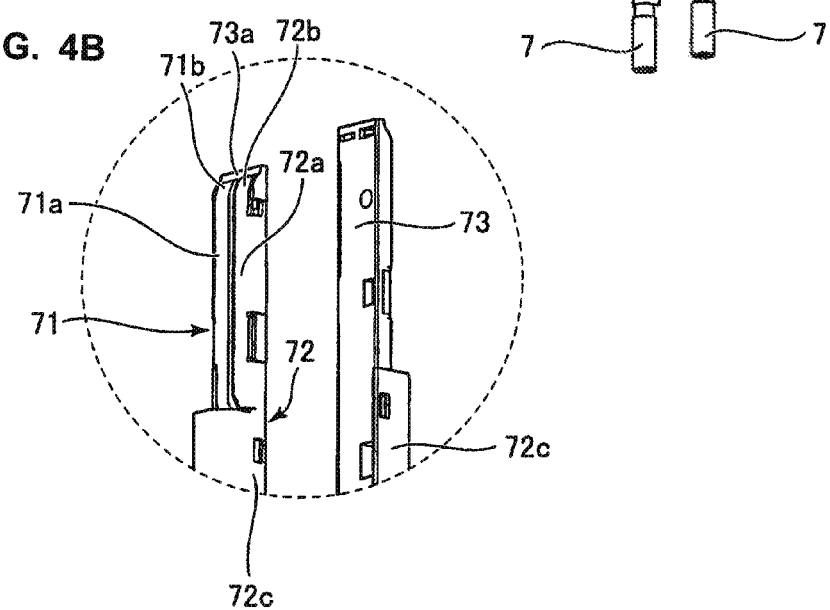
FIG. 4B is an enlarged view of a part of FIG. 4A, which is surrounded by a broke line B.
Figure 5:
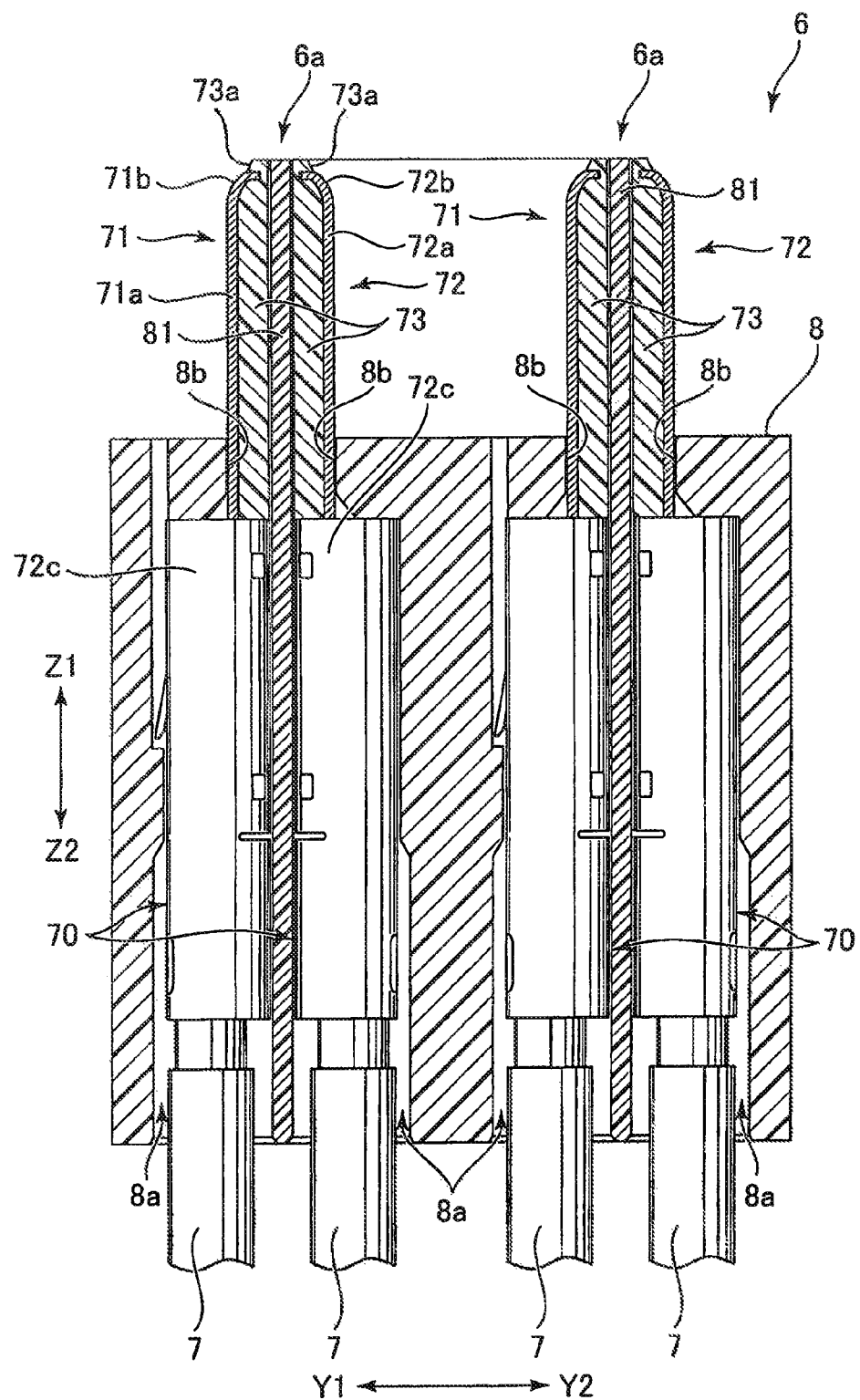
FIG. 5 is a cross-sectional view taken along the line V-V of FIG. 3.

As described above, the semiconductor testing device 10 in this example includes the cable assemblies 6 employed as electronic components connected to the connectors 1. FIG. 4(A) is an exploded perspective view of the cable assembly 6. The plurality of coaxial cables 7 and the connector 8, which constitute the cable assembly 6, are illustrated in FIG. 4(A). FIG. 4(B) is an enlarged view of a part of FIG. 4(A), which is surrounded by the broken line B. FIG. 5 is a cross-sectional view of the cable assembly 6.

Each of the coaxial cables 7 includes a signal line, and a ground line which is shaped into a tube that surrounds the signal line. As illustrated in FIG. 4 or FIG. 5, a cable terminal 70 fixed at the end of the coaxial cable 7 includes a signal terminal 71 connected to the signal line and a ground terminal 72 connected to the ground line. In the example described here, the signal terminal 71 includes a contact plate 71a shaped into a plate extending upward. The ground terminal 72 includes a base portion 72c which is formed into a semi-tubular shape curved to cover the ground line and the signal line, and the inner surface of the base portion 72c is attached on the ground line. Further, the ground terminal 72 includes a contact plate 72a which is formed into a slim plate extending upward from the base portion 72c. The contact plates 71a and 72a are arranged next to each other. Further, the coaxial cable 7 includes a base 73 which is formed into a slim board extending upward, and the contact plates 71a and 72a are disposed on the base 73.

As illustrated in FIG. 5, the connector 8 has a plurality of insertion holes 8a formed therein, the insertion holes 8a being elongated in the up-and-down direction. Each of the insertion holes 8a is open downward, and the cable terminals 70 are respectively inserted into the insertion holes 8a from below. A through-hole 8b is formed at the back of each of the insertion hole 8a, penetrating through the connector 8. The base 73 and the contact plates 71a and 72a are arranged to protrude upward through the through-hole 8b. The connector 8 includes protruding portions 81 extending upward from an edge of the through-hole 8b. The base 73 and the contact plates 71a and 72a, which have passed through the through-hole 8b, are arranged along the protruding portion 81.

In this example, as illustrated in FIG. 5, a plurality (four in this example) of insertion holes 8a are arrayed in the front-and-back direction (Y1-Y2 direction), and the two adjacent insertion holes 8a make a pair. The protruding portion 81 extends upward from between the through-holes 8b formed in paired insertion holes 8a. The bases 73 and contact plates 71a and 72a of two cable terminals 70 inserted into the paired insertion holes 8a are located opposite to each other across the protruding portion 81. Further, the insertion holes 8a in this example are also arrayed in the right-and-left direction, so that the protruding portion 81 is formed into a board shape elongated in the right-and-left direction (X1-X2 direction). The cable terminals 70 disposed on the protruding portions 81 are also arrayed in the right-and-left direction. The pair of bases 73 disposed on both sides of the protruding portion 81, and the pair of contact plates 71a and 72a disposed on both sides of the protruding portion 81, form each of inserted portions 6a of the cable assembly 6, which is employed as a portion inserted into the connector 1. The inserted portion 6a includes, on both sides thereof, the contact plates 71a and 72a to be brought into contact with the terminals 20 and 30 provided in the connector 1. In this regard, as illustrated in FIG. 4, both sides of the protruding portion 81 have a plurality of wall portions 81a formed thereon, each of which extends upward from between two through-hoes 8b next to each other. The base 73 and the contact plates 71a and 72a are disposed between two wall portions 81a next to each other (refer to FIG. 3).

The inserted portion 6a includes a taper reducing in thickness toward the tip of the inserted portion 6a. To be specific, as illustrated in FIG. 4(b) or FIG. 5, a taper 73a is formed on the tip of the base 73. Further, the signal terminal 71 includes a taper 71b on the tip of the contact plate 71a, and the ground terminal 72 includes a taper 72b on the tip of the contact plate 72a. The taper 73a and the taper 71b are arrayed from the tip of the inserted portion 6a, the taper 71b following the taper 73a. In a similar way, the taper 73a and the taper 72b are also arrayed from the tip of the inserted portion 6a, the taper 72b following the taper 73a. These tapers 73a and 71b and tapers 73a and 72b incline with respect to an insertion direction of the cable assembly 6. In other words, the tapers 73a, 71b and 72b are disposed on right and left sides of the protruding portion 81, and incline such that the interval between them becomes smaller toward their tips, that is, the tip side of the inserted portion 6a reduces in thickness toward its tip.

Figure 6:
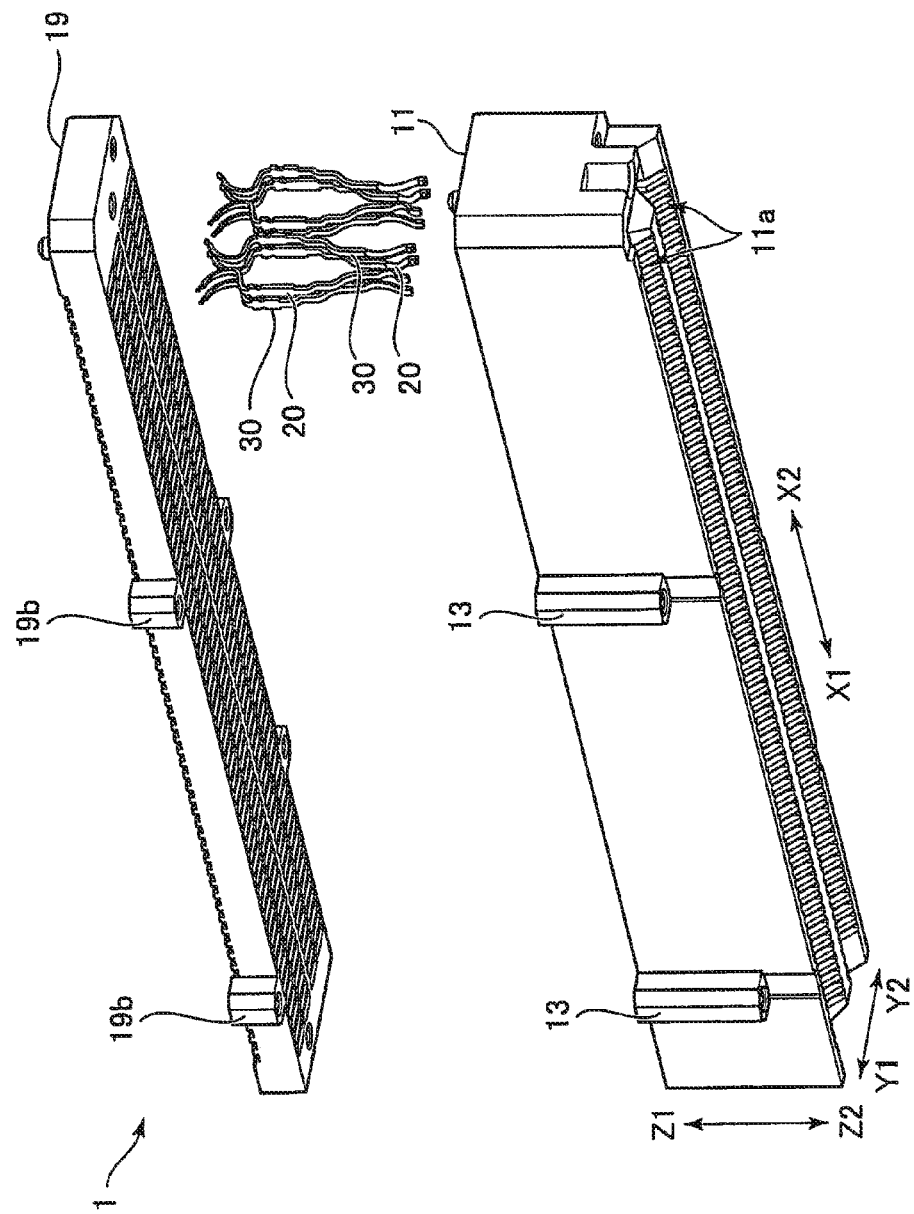
FIG. 6 is an exploded perspective view of the connector according to the present invention.
Figure 7:
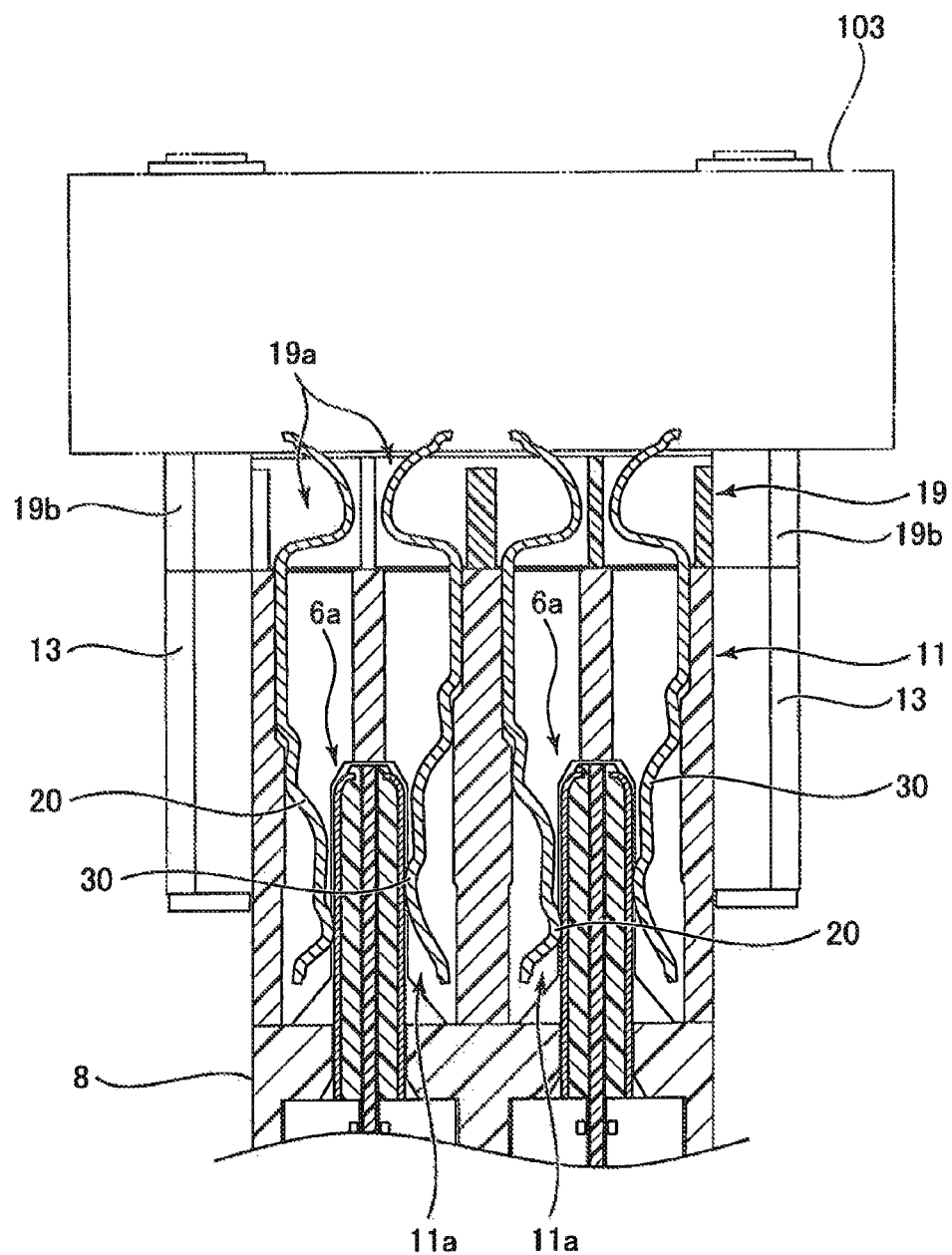
FIG. 7 is a cross-sectional view taken along the line VII-VII of FIG. 3.
Figure 8:
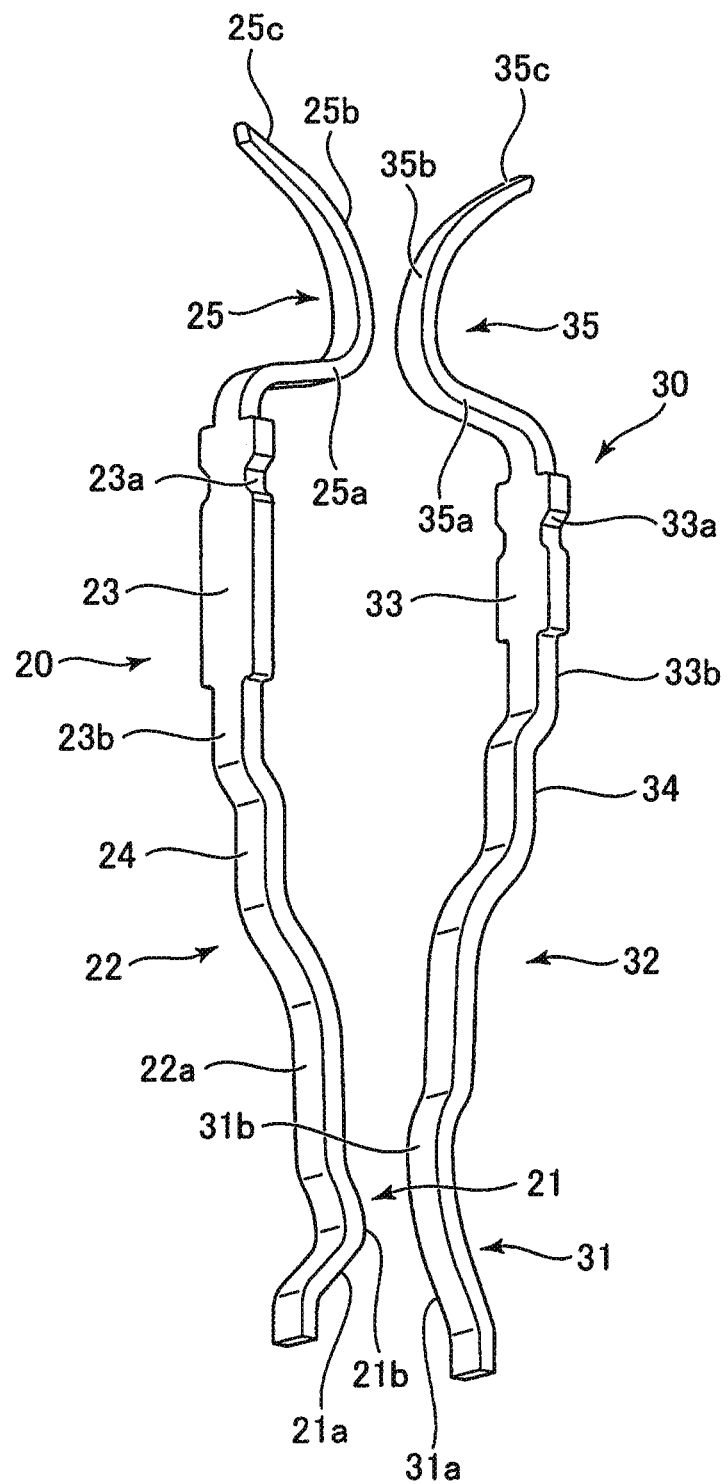
FIG. 8 is a perspective view of a terminal provided into the connector according to the present invention.
Figure 9:
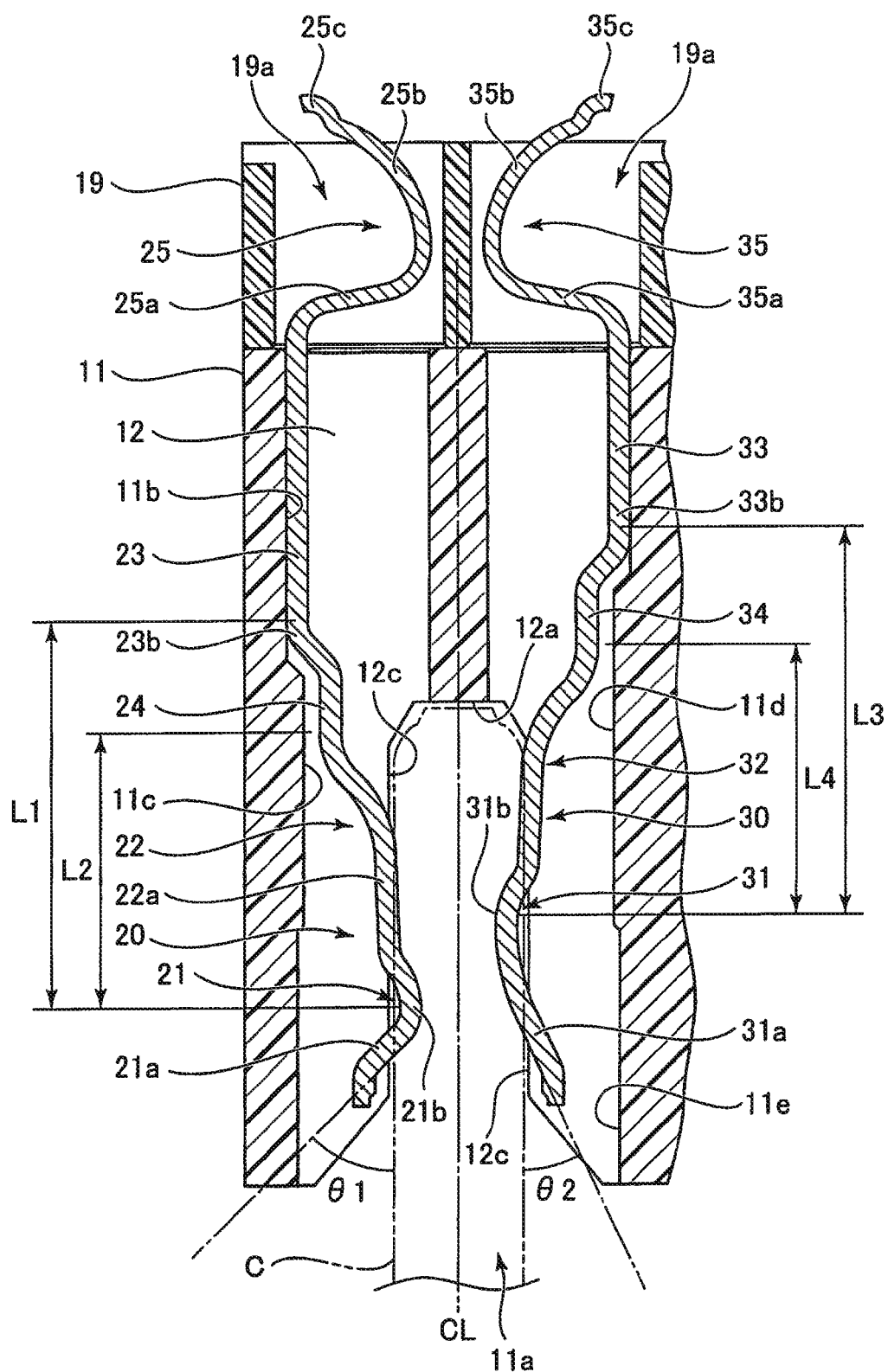
FIG. 9 is an enlarged cross-sectional view of the connector according to the present invention.
Figure 10:
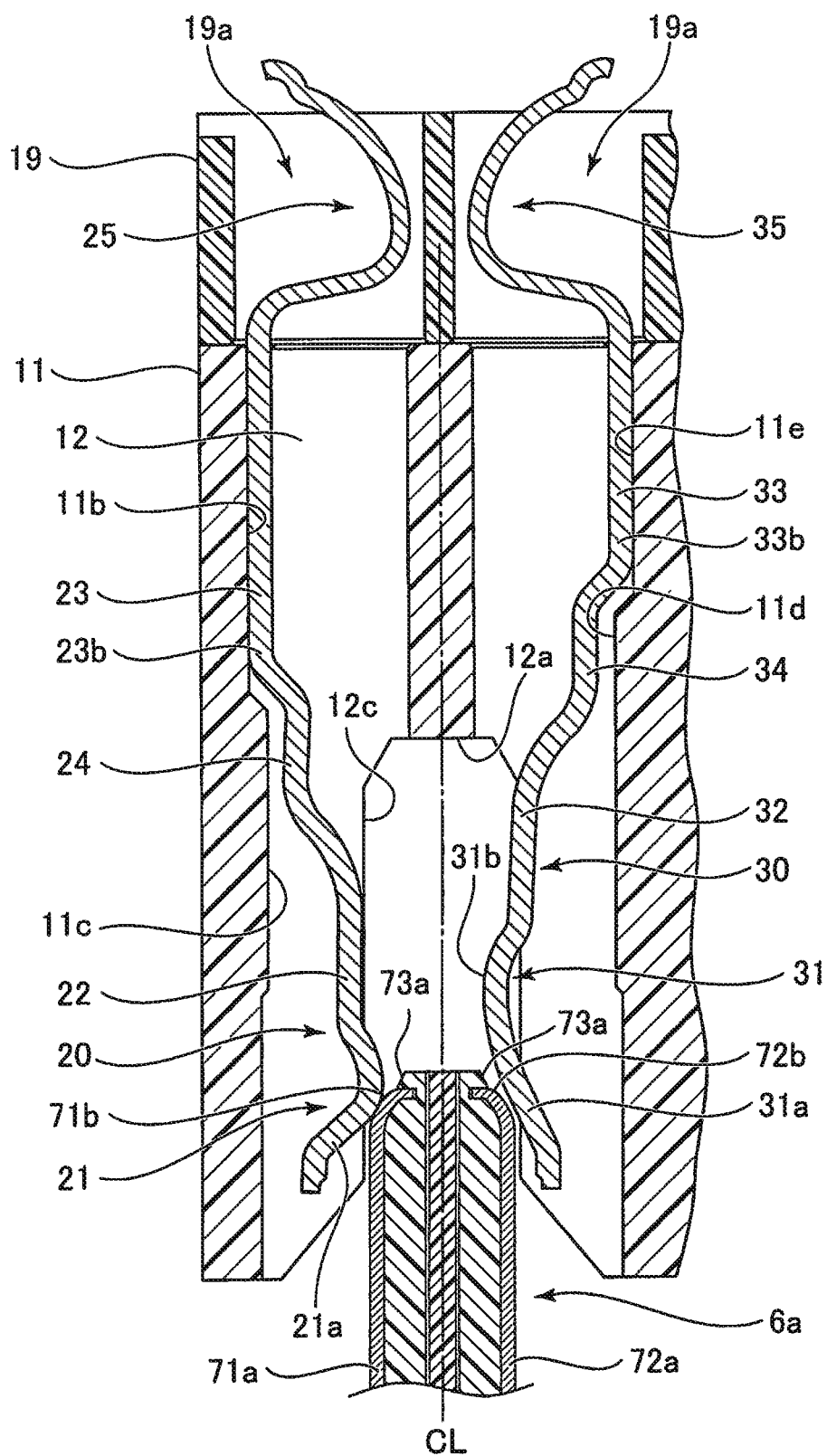
FIG. 10 is a cross-sectional view illustrating a process in which the cable assembly is inserted into the connector according to the present invention, showing a state where a tip of the cable assembly hits against a contact portion of a first terminal of the connector.
Figure 11:
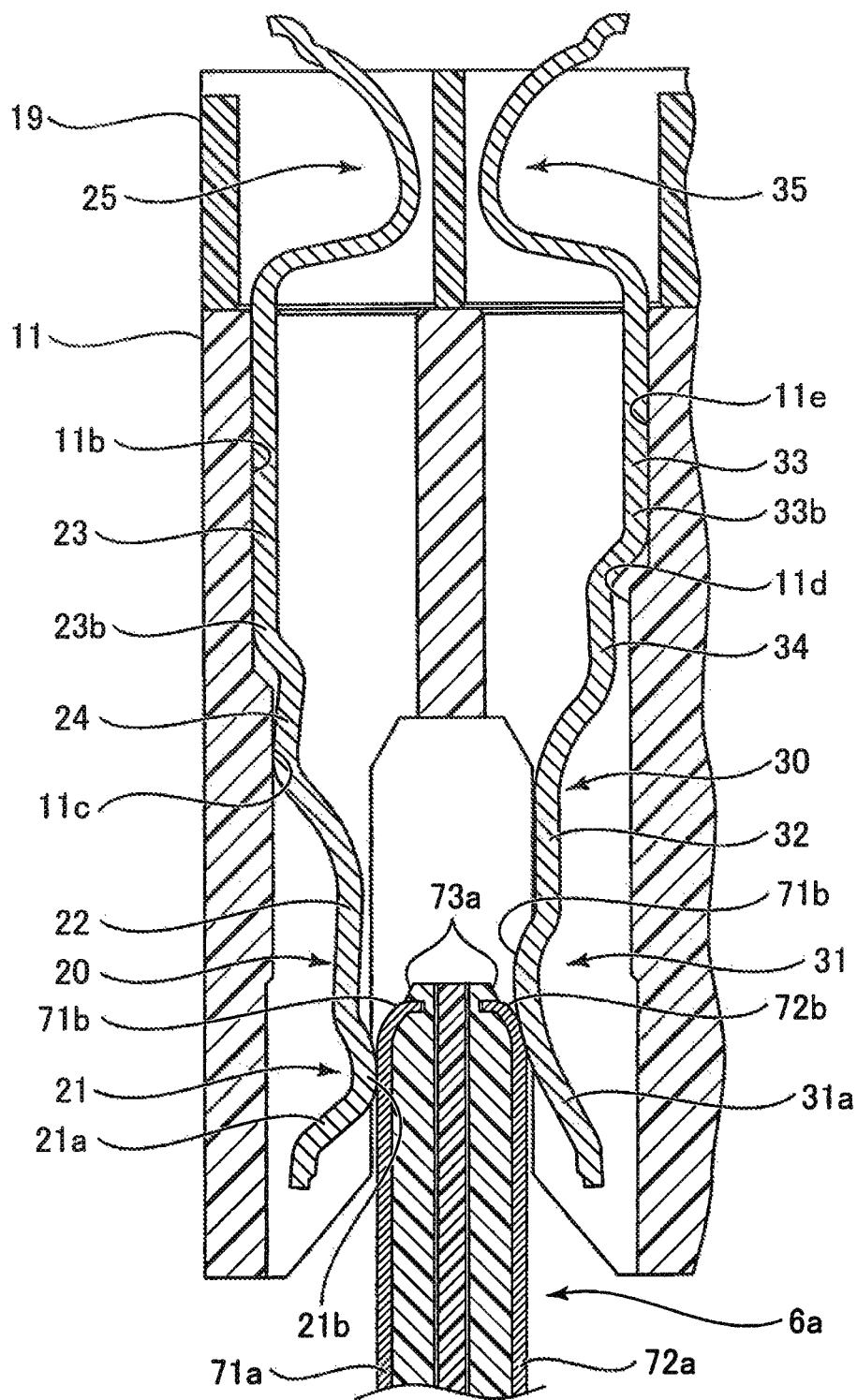
FIG. 11 is a cross-sectional view illustrating the process in which the cable assembly is inserted into the connector according to the present invention, showing a state where the tip of the cable assembly passes by a top of the contact portion of the first terminal, and hits against a contact portion of a second terminal.
Figure 12:
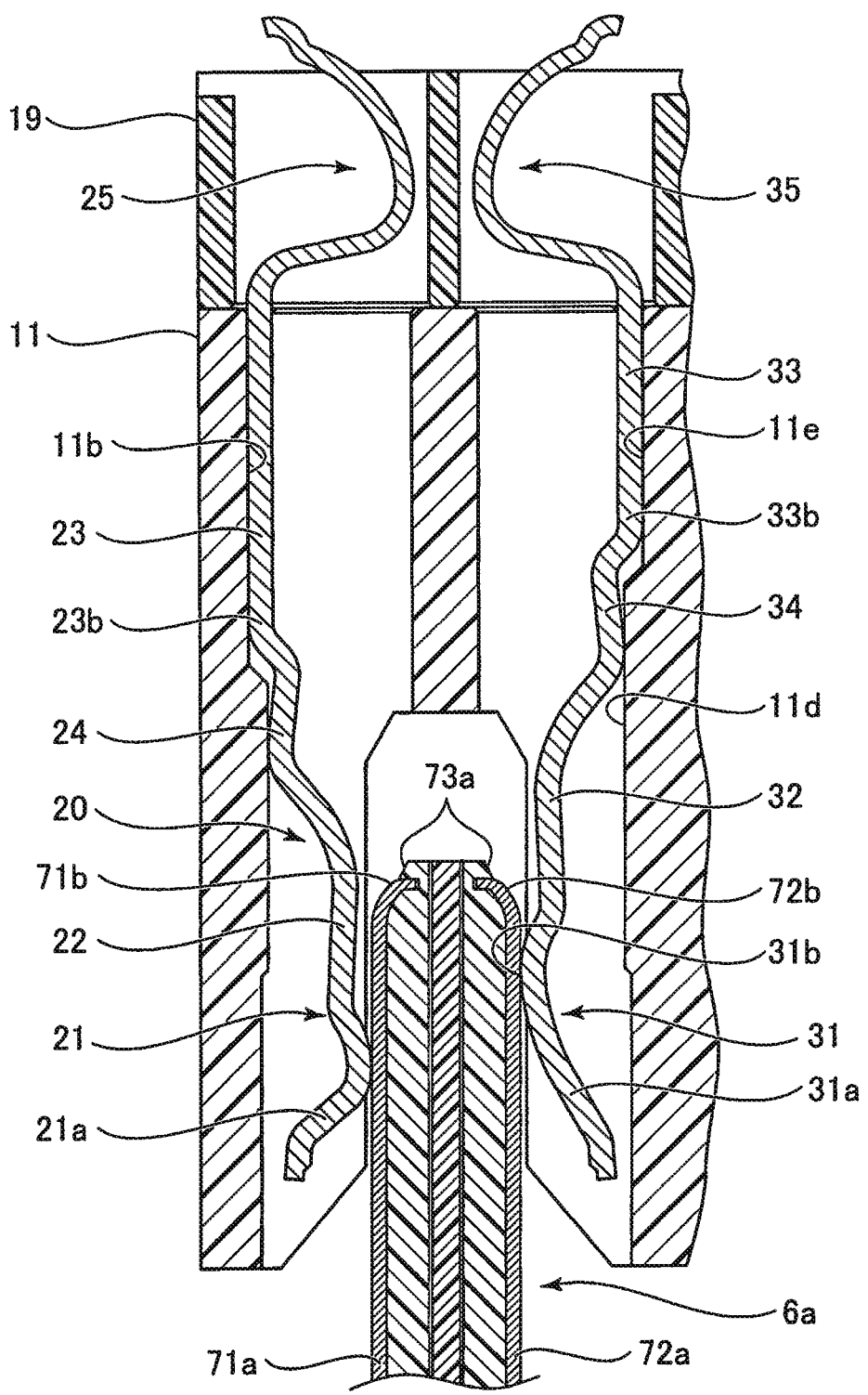
FIG. 12 is a cross-sectional view illustrating a state after the cable assembly is inserted into the connector according to the present invention, showing a state where the tip of the cable assembly has passed by a top of the contact portion of the second terminal.

A description will be given of the connector 1 in detail. FIG. 6 is an exploded perspective view of the connector 1. FIG. 7 is a cross-sectional view of the connector 1. FIG. 8 is a perspective view of the first terminal 20 and the second terminal 30, which are provided in the connector 1. FIG. 9 is an enlarged cross-sectional view of the connector 1. FIGS. 10 to 12 are cross-sectional views illustrating a process in which the cable assembly 6 is inserted into the connector 1. FIG. 10 shows a state where the tip of the cable assembly 6 hits against a contact portion 21 of the first terminal 20 of the connector 1. FIG. 11 shows a state where the tip of the cable assembly 6 has passed by a top 21b of the contact portion 21 of the first terminal 20, and hits against a contact portion 31 of the second terminal 30. FIG. 12 shows a state where the tip of the cable assembly 6 has passed by a top 31b of the contact portion 31 of the second terminal 30.

As illustrated in FIG. 6 and FIG. 7, the connector 1 includes a housing 11, a plurality of first terminals 20, and a plurality of second terminals 30, each of which is formed into a plate spring shape. The housing 11 has a plurality of insertion holes 11a formed therein, each of which penetrates the housing 11 in the up-and-down direction. The first terminals 20 and the second terminals 30 are accommodated in the insertion holes 11, and are arranged to extend in an insertion-and-removal direction (up-and-down direction (Z1-Z2 direction) in this example) of the cable assembly 6. Further, the first terminal 20 and the second terminal 30 making a pair are disposed inside one single insertion hole 11a, facing each other.

The plurality of insertion holes 11a are arrayed in the right-and-left direction (X1-X2 direction). As illustrated in FIG. 9, each of the insertion holes 11a is defined by side surfaces 11b and 11d facing each other in the front-and-back direction (Y1-Y2 direction), and defined by wall portions 12, each partitioning two adjacent insertion holes 11a. The first terminal 20 and the second terminal 30, which are inserted into the insertion hole 11a, are alternately arrayed in the right-and-left direction. Further, the plurality of insertion holes 11a are also arrayed in the front-and-back direction. In this example, the plurality of insertion holes 11a form two rows elongated in the right-and-left direction. As described later, fixed portions 23 and 33 formed on the first terminal 20 and the second terminal 30 are fixed to the housing 11, their movable portions 22 and 32 being allowed to elastically deform toward the side surfaces 11b and 11d.

The plurality of insertion holes 11a are formed so that the inserted portion 6a of the cable assembly 6 is inserted into the insertion holes 11a. In this example, the plurality of insertion holes 11a arrayed in the right-and-left direction (X1-X2 direction) communicate with each other through their lower sections, so that the inserted portions 6a can be inserted into the lower sections of the insertion holes 11a. To be specific, the wall portion 12 is formed between two adjacent insertion holes 11a, partitioning these holes. The wall portion 12 has a recessed portion 12a formed therein, which is recessed in an insertion direction (recessed upward (Z1 direction)) of the cable assembly 6. Accordingly, the insertion holes 11a communicate with each other through the recessed portion 12a. As described above, the inserted portion 6a includes the board shaped protruding portion 81 elongated in the right-and-left direction, and the contact plates 71a and 72a arranged along both side surfaces of the protruding portion 81. The recessed portion 12a is defined as a pair of edges 12c and 12c facing each other and extending in the up-and-down direction. The inserted portion 6a advances inside the housing 11 along the edges 12c. In other words, a course C in which the inserted portion 6a advances is defined by the edges 12c of the recessed portion 12.

The first terminal 20 includes a contact portion 21 on its tip side. The contact portion 21 is curved such that the middle thereof swells toward the centerline CL of the course C in the insertion hole 11a. The contact portion 21 is located on the course C in the insertion hole 11a. In other words, the contact portion 21 is located closer to the centerline CL of the course C than the edge 12c of the recessed portion 12. Therefore, as illustrated in FIG. 10, in an insertion process of the cable assembly 6, the tip (in this example, the tapers 73a and 71b provided on the tip of the cable terminal 70) of the inserted portion 6a hits against the contact portion 21. In this example, the contact portion 21 includes a guide portion 21a extending in a direction opposite to the insertion direction of the cable assembly 6. The guide portion 21a extends to become more distant from the course C, and thereby inclines at an angle θ1 with respect to the insertion direction. In the insertion process of the cable assembly 6, the tip of the inserted portion 6a first hits against the guide portion 21a, and pushes the contact portion 21 toward the side surface 11b, which is located apart from the course C, of the insertion hole 11a.

Further, the first terminal 20 includes a movable portion 22 which includes the contact portion 21 on the tip side of the movable portion 22. The movable portion 22 extends from the contact portion 21 toward the side surface 11b of the insertion hole 11a. In other words, the movable portion 22 extends obliquely with respect to the insertion direction of the cable assembly 6 toward the back (that is, the deep section) of the insertion hole 11a.

The first terminal 20 includes a fixed portion 23 on a base side of the movable portion 22. The fixed portion 23 is fixed to the housing 11 and is restricted from moving. In this example, as illustrated in FIG. 8 or FIG. 9, the fixed portion 23 has a plate shape wider than the movable portion 22. The fixed portion 23 is arranged along the side surface 11b, being in contact with the side surface 11b. Further, the fixed portion 23 is sandwiched by, and held by, the wall portions 12, each of which is defined as a wall partitioning the two adjacent insertion holes 11a. Specifically, engaging portions 23a are formed on right and left edges of the fixed portion 23. The fixed portion 23 is press-fitted into the insertion hole 11a, and the engaging portions 23a are caught on the wall portions 12.

As described above, the first terminal 20 is formed into a plate spring, so that the movable portion 22 can be elastically deformed to incline toward the side surface 11b of the insertion hole 11a using the fixed portion 23 as a fixed point of inclining. In other words, as illustrated in FIG. 10 and FIG. 11, the movable portion 22 can be elastically deformed so that the contact portion 21 recedes from the course C toward the side surface 11b (that is, so that the contact portion 21 is allowed to move in a direction perpendicular to the insertion direction of the cable assembly 6). When the contact portion 21 is pushed by the tapers 73a and 71b of the cable terminal 70, the movable portion 22 inclines while using the fixed portion 23 as the fixed point. In this example, the movable portion 22 inclines using an end 23b of the fixed portion 23, which is defined as one end closer to the movable portion 22, as the fixed portion.

The movable portion 22 includes a hit portion 24 between the contact portion 21 and the fixed portion 23. As illustrated in FIG. 9, in a free state (state where external force does not act on the movable portion 22) of the movable portion 22, the hit portion 24 is spaced apart from the side surface 11b of the insertion hole 11a. In this example, a step is formed between the hit portion 24 and the fixed portion 23. By forming the step, the hit portion 24 is located closer to the centerline CL of the course C than the fixed portion 23, and has a gap formed between the hit portion 24 and the side surface 11b. In this example a convex portion 11c that protrudes toward to the course C is formed on the side surface 11b. The gap is formed between the convex portion 11c and the hit portion 24. In the free state of the movable portion 22, the hit portion 24 is arranged substantially parallel to the surface of the convex portion 11c.

Further, the hit portion 24 is provided capable of hitting, midway during inclining of the movable portion 22 toward the side surface 11b, against the convex portion 11c. Specifically, a distance between the hit portion 24 and the convex portion 11c in the free state is defined such that the hit portion 24 can hit against the side surface 11b before the contact portion 21 reaches a position (position of the contact portion 21 illustrated in FIG. 11 or FIG. 12) of receding from the course C. Therefore, as illustrated in FIG. 10 and FIG. 11, the hit portion 24 hits against the side surface 11b during a period between the time when the tip (here, tapers 73a and 71b) of the cable terminal 70 hits against the guide portion 21a of the contact portion 21 and the time when the tip of the cable terminal 70 passes by the top 21b of the contact portion 21. To be more specific, as illustrated in FIG. 10, at the beginning when the tapers 73a and 71b hit against the guide portion 21a of the contact portion 21, the movable portion 22 inclines toward the side surface 11b, employing the end of the fixed portion 23 as the fixed point of inclining. In this period, though the hit portion 24 is approaching the side surface 11b, the hit portion 24 is still spaced apart from the side surface 11b. As illustrated in FIG. 11, when the tapers 73a and 71b pass by the top 21b of the contact portion 21, and the contact plate 71a reaches the top 21b of the contact portion 21, the hit portion 24 becomes pressed on the side surface 11b. The distance between the hit portion 24 and the convex portion 11c in the free state is defined so that the hit portion 24 can hit, midway during shifting from the state of FIG. 10 to the state of FIG. 11, against the convex portion 11c.

The movable portion 22 is elastically deformable, employing the hit portion 24 as the fixed point. Therefore, after the hit portion 24 hits against the side surface 11b, the movable portion 22 further inclines toward the side surface 11b while employing the hit portion 24, in place of the fixed portion 23, as the fixed point of inclining. The top 21b of the contact portion 21 is pressed against the contact plate 71a by an elastic force of the movable portion 22 having deformed while using the hit portion 24 as the fixed point.

The distance L2 between the hit portion 24 and the contact portion 21 is smaller than the distance L1 between the end 23b of the fixed portion 23 and the contact portion 21. As a result, the elastic force of the movable portion 22 having deformed while using the hit portion 24 as the fixed point is larger than elastic force of the movable portion 22 deformed while using the end 23b of the fixed portion 23 as the fixed point. Therefore, the top 21b of the contact portion 21 is pressed against the contact plate 71a with an elastic force larger than the elastic force exerted by the movable portion 22 at the beginning when the tapers 73a and 71b hit against the guide portion 21a.

As described above, the connector 1 includes the second terminals 30. As illustrated in FIG. 9, each of the second terminals 30 is arranged to face the first terminal 20 across the course C. In a similar way to the first terminal 20, the second terminal 30 includes the contact portion 31, on its tip side. The contact portion 31 is curved such that its middle portion swells toward the course C. This contact portion 31 is also located on the course C. Therefore, as illustrated in FIG. 11, in the insertion process of the cable assembly 6, the tip (here, tapers 73a and 72b provided on the tip of the cable terminal 70) of the inserted portion 6a hits against the contact portion 31. In this example, the contact portion 31 includes a guide portion 31a. The guide portion 31a extends to become more distant from the course C, and thereby inclines at an angle θ2 with respect to the insertion direction, in a similar way to the guide portion 21a. The tapers 73a and 72b first hit against the guide portion 31a. The first terminal 20 and the second terminal 30 are arranged to face each other, so that the guide portion 21a and the guide portion 31a incline such that the interval between them becomes wider toward their tips.

Further, the second terminal 30 also includes a movable portion 32. The movable portion 32 includes the contact portion 31 on its tip side. In a similar way to the movable portion 22, the movable portion 32 also extends from the contact portion 31 toward another side surface (side surface facing the side surface 11b on which the first terminal 20 is disposed) 11e of the insertion hole 11a.

The second terminal 30 includes a fixed portion 33 on the base side of the movable portion 32. In a similar way to the fixed portion 23, the fixed portion 33 is fixed to the housing 11 and restricted from moving. In this example, the fixed portion 33 is formed into a plate shape wider than the movable portion 32, and is arranged along the side surface 11e. Further, the fixed portion 33 is sandwiched by, and held by, the two adjacent wall portions 12. Specifically, as illustrated in FIG. 8, engaging portions 33a are formed on right and left edges of the fixed portion 33. The fixed portion 33 is press-fitted into the insertion hole 11a, and the engaging portions 33a are caught on the wall portion 12.

In a similar way to the movable portion 22, the movable portion 32 is elastically deformable to incline toward the side surface 11e of the insertion hole 11a, employing the fixed portion 33 as the fixed portion of inclining. In this example, when the guide portion 31a of the contact portion 31 is pushed by the tapers 73a and 72b, the movable portion 32 inclines such that the contact portion 31 recedes from the course C, using an end 33b of the fixed portion 33 as the fixed portion of inclining.

The movable portion 32 includes a hit portion 34 between the contact portion 31 and the fixed portion 33. As illustrated in FIG. 9, in a similar way to the hit portion 24, in a free state (state where external force does not act on the movable portion 32) of the movable portion 32, the hit portion 34 is spaced apart from the side surface 11e of the insertion hole 11a. In this example, a convex portion 11d protruding toward the course C is formed on the side surface 11e opposite to the side surface 11e on which the first terminal 20 is disposed. A gap is formed between the convex portion 11d and the hit portion 34.

Further, in a similar way to the hit portion 24, the hit portion 34 is provided capable of hitting, midway during inclining of the movable portion 32 toward the side surface 11e, against the side surface 11e (convex portion 11d in this example). Therefore, as illustrated in FIG. 11 and FIG. 12, the hit portion 34 hits against the convex portion 11d during the period between the time when the tip (here, tapers 73a and 72b) of the cable terminal 70 hits against the guide portion 31a of the contact portion 31 and the time when the tapers 73a and 72b pass by the contact portion 31. In a similar way to the movable portion 22, the movable portion 32 is also elastically deformable, using the hit portion 34 as the fixed point of inclining. Therefore, after the hit portion 34 hits against the side surface 11e, the movable portion 32 further inclines toward the side surface 11e while using the hit portion 34, in place of the fixed portion 33, as the fixed point of inclining. The contact portion 31 is pressed against the contact plate 72a by elastic force of the movable portion 32, which is a force generated by using the hit portion 34 as the fixed point.

In this regard, the distance L4 between the hit portion 34 and the contact portion 31 is equal to the distance L2 between the hit portion 24 and the contact portion 21. Therefore, the contact portion 21 and the contact portion 31 are respectively pressed against the contact plates 71a and 72a with forces substantially equal to each other. Further, the distance L1 between the end 23b of the fixed portion 23 and the contact portion 21 is equal to the distance L3 between the end 33b of the fixed portion 33 and the contact portion 31.

As illustrated in FIG. 9, the contact portion 21 of the first terminal 20 and the contact portion 31 of the second terminal 30 have a positional difference in the insertion direction of the cable assembly 6. In this example, the contact portion 31 of the second terminal 30 is located at a deeper position in the insertion hole 11a than that of the contact portion 21. Specifically, the top 31b of the contact portion 31 is located at a deeper position in the insertion hole 11a than that of the top 21b of the contact portion 21. Thus, the top 31b of the contact portion 31 faces an extending portion 22a which extends from the end of the contact portion 21 to be located closer to the side surface 11b than the top 21b.

As described above, the guide portion 21a and the guide portion 31a incline such that the interval between them becomes wider toward their tips. In this example, the inclination angle θ2 of the guide portion 31a with respect to the insertion direction is smaller than the inclination angle θ1 of the guide portion 21a with respect to the insertion direction. Therefore, the rate of increase of the insertion force, which increases in the insertion process of the cable assembly 6, required for the first terminal 20 is lower than the rate of increase of the insertion force required for the second terminal 30.

Figure 13:
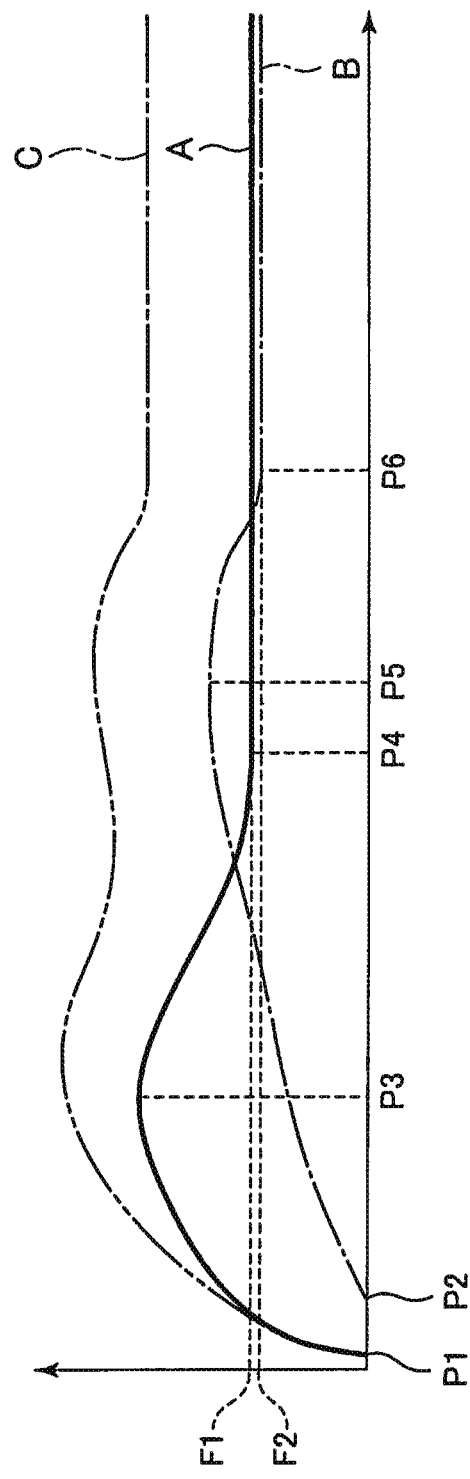
FIG. 13 is a graph showing examples of changes of insertion forces required for insertion of the cable assembly.

FIG. 13 is a graph showing examples of changes of the insertion forces. In FIG. 13, the horizontal axis represents positions of the cable assembly 6, and the vertical axis represents the insertion forces. Further, in FIG. 13, a line A represents the insertion force required for the first terminal 20, and a line B represents the insertion force required for the second terminal 30. Further, a line C represents a sum of the insertion forces represented by the line A and the line B.

As shown by the line A, the insertion force starts to rise at the time when the cable assembly 6 reaches a position P1 where the tapers 73a and 71b of the inserted portion 6a hit against the guide portion 21A of the contact portion 21. At this time, the insertion force is required to exceed a sum of a reaction force (force in an opposite direction to the insertion direction) generated from the movable portion 22 deforming to incline toward the side surface 11b and a frictional force between the guide portion 21a and the tapers 73a and 71b. The insertion force required for the first terminal 20 becomes maximum at a point P3 indicated in FIG. 13. After the cable assembly 6 is inserted to a position P4 where the contact plate 71a reaches the top 21b of the contact portion 21, the insertion force for the first terminal 20 is required to exceed only the frictional force between the contact plate 71a and the top 21b of the contact portion 21. Therefore, after the cable assembly 6 is inserted to the position P4, the cable assembly 6 can be inserted with insertion force F1 smaller than the insertion force at the position P3.

Further, as shown by the line B, the insertion force required for the second terminal 30 gradually starts to rise at the time when the cable assembly 6 is inserted to a position P2 where the tapers 73a and 72b hit against the guide portion 31a of the contact portion 31. At this time, the insertion force for the second terminal 30 is required to exceed a sum of a reaction force generated from the movable portion 32 deforming to incline toward the side surface 11e and a frictional force between the guide portion 31a and the tapers 73a and 72b.

As described above, the inclination angle θ2 of the guide portion 31a of the contact portion 31 with respect to the insertion direction is smaller than the inclination angle θ1 of the guide portion 21a with respect to the insertion direction. Therefore, the insertion force required for the second terminal 30 rises more gently than the insertion force required for the first terminal 20.

The insertion force required for the second terminal 30 becomes maximum at a position P5 indicated in FIG. 13. As described above, the top 31b of the contact portion 31 is located at a deeper position in the insertion hole 11a than that of the top 21b of the contact portion 21. Therefore, the position P5 where the insertion force required for the second terminal 30 reaches the maximum is located further rearward than the position P3 where the insertion force required for the first terminal 20 reaches the maximum (that is, the position P5 located at a deeper position than the position P3). In this example, a positional relationship between the top 21b and the top 31b is defined so that the position P5 is located at a deeper position in the insertion hole 11a than the position P4 where the contact plate 71a reaches the top 21b of the contact portion 21.

Further, the inclination angle θ2 of the guide portion 31a of the contact portion 31 is smaller than the inclination angle θ1 of the guide portion 21a of the contact portion 21, and further, as illustrated in FIG. 9, a curvature of the contact portion 31 is larger than a curvature of the contact portion 21. Therefore, the reaction force (force in the opposite direction to the insertion direction) generated from the second terminal 30 is smaller than the reaction force generated from the first terminal 20. As a result, the maximum value (insertion force at the position P5) of the insertion force for the second terminal 30 is smaller than the maximum value (insertion force at the position P3) of the insertion force for the first terminal 20.

After the cable assembly 6 is inserted to a position P6 where the contact plate 72a reaches the top 31b of the contact portion 31, the insertion force for the second terminal 30 is required to only resist friction between the contact plate 72a and the top 31b, and accordingly, the cable assembly 6 can be inserted with insertion force F2 smaller than the insertion force at the position P5.

As described above, the position P5 where the insertion force required for the second terminal 30 becomes maximum is located at a deeper position in the insertion hole 11a than that of the position P4 where the contact plate 71a reaches the top 21b of the contact portion 21. Specifically, the insertion force for the second terminal 30 reaches the maximum after the insertion force for the first terminal 20 reduces to the force only resisting the friction between the contact plate 71a and the top 21b of the contact portion 21. Therefore, as shown by the line C, the sum of the insertion forces at the position P5 is lower than the sum of the insertion forces at the position P3. Therefore, compared with a connector in which the sum of the insertion forces becomes the maximum at the position P5, the cable assembly 6 can be smoothly inserted into the connector 1.

Finally, a description will be given of an attachment structure of the connector 1 to the performance board 103. As illustrated in FIG. 8, the first terminal 20 and the second terminal 30 include pressed portions 25 and 35 respectively extending upward from the fixed portions 23 and 33. The pressed portions 25 and 35 extend upward, and are curved so as to extend/shorten in the up-and-down direction. In other words, the pressed portions 25 and 35 include extending portions 25a and 35a and curved portions 25b and 35b, respectively. The extending portions 25a and 35a extend from the fixed portions 23 and 33 toward the centerline CL of the insertion hole 11a. The curved portions 25b and 35b extend upward from the extending portions 25a and 35a, and are curved such that the interval between them increases toward their tips. The curved portions 25b and 35b include, on their tips, contact portions 25c and 35c which face to the lower surface of the performance board 103. When the contact portions 25c and 35c are pressed on conductors (not shown) formed on the lower surface of the performance board 103, the pressed portions 25 and 35 warp downward such that the positions of contact portions 25c and 35c lower. In this regard, as illustrated in FIG. 6 or FIG. 7, the connector 1 includes a housing 19, in addition to the housing 11, in which insertion holes 19a and 19a are formed. The pressed portions 25 and 35 are respectively inserted into the insertion holes 19a and 19b.

As illustrated in FIG. 6, attachment portions 13 are provided on an outer surface of the housing 11. Each of the attachment portions 13 is attached to the performance board 103, for example, by a rivet or a bolt. Specifically, each of the attachment portions 13 has a through-hole formed therein and penetrating the attachment portion 13. The rivet or the like is inserted through the through-hole, and is fixed to the performance board 103. As a result, the pressed portions 25 and 35 are pressed on the lower surface of the performance board 103.

In this regard, when the housing 11 is mounted on the performance board 103, the housing 19 is sandwiched by the performance board 103 and the housing 11 (refer to FIG. 7). Further, the housing 19 includes attachment portions 19b on the outer surface of the housing 19. Each of the attachment portions 19b has a through-hole formed therein, through which the rivet or the like for attaching the housing 11 on the performance board 103 is inserted.

As described above, the connector 1 includes the first terminal 20 formed into a plate spring arranged to extend in the insertion-and-removal direction of the cable assembly 6. The movable portion 22 of the first terminal 20 includes, on its tip side, the contact portion 21 located on the course C of the cable assembly 6 in the insertion hole 11a. The movable portion 22 extends toward the side surface 11b, which is positioned apart from the course C, of the insertion hole 11a. Further, the first terminal 20 includes the fixed portion 23, and the movable portion 22 is elastically deformable to incline toward the side surface 11b of the insertion hole 11a while using the fixed portion 23 as the fixed point of inclining. Further, the movable portion 22 includes the hit portion 24 between the contact portion 21 and the fixed portion 23, the hit portion 24 being spaced apart from the side surface 11b of the insertion hole 11a. Moreover, the hit portion 24 is provided capable of hitting, midway during inclining of the movable portion 22 toward the side surface 11b of the insertion hole 11a, against the side surface 11b of the insertion hole 11a.

In accordance with the connector 1 described above, as illustrated in FIG. 10 and FIG. 11, the movable portion 22 can be elastically deformed while using the fixed portion 23 as the fixed point at the beginning when the cable assembly 6 hits against the contact portion 21. Then, the movable portion 22 can start to be elastically deformed while using the hit portion 24 as the fixed point midway during elastic deformation of the movable portion 22. The hit portion 24 is located between the fixed portion 23 and the contact portion 21. Accordingly, the elastic force generated by the elastic deformation of the first terminal 20, using the hit portion 24 as the fixed point, can be greater than the elastic force generated by the elastic deformation of the first terminal 20 using the fixed portion 23 as the fixed point. As a result, the counter force generated when the cable assembly 6 hits against the contact portion 21 can be reduced, and a force for pressing the contact portion 21 onto the conductor (here, contact plate 71a) of the cable assembly 6 can be sufficiently secured, by means of increasing the distance between the contact portion 21 and the fixed portion 23 and reducing the distance between the contact portion 21 and the hit portion 24.

Note that the present invention is not limited to the connector 1 described above, and a variety of alterations are possible.

In the above description, the cable assembly 6 including the coaxial cables 7 is connected to the connector 1. However, the electronic component connected to the connector 1 is not limited to the cable assembly 6. For example, a circuit board or an electronic component such as a flexible printed circuit (FPC) may be connected to the connector 1.

Further, in the above description, the hit portion 24 of the first terminal 20 hits against the convex portion 11c formed on the side surface 11b of the insertion hole 11a. However, the convex portion 11c does not have to be formed on the side surface 11b.

Further, the hit portion 24 hits against the surface of the convex portion 11c. However, the convex portion 11c and the hit portion 24 may be formed so that the hit portion 24 hits against a corner of the convex portion 11c.

Further, in the above description, the connector 1 is used in the semiconductor testing device 10. However, the connector 1 may be used in other electronic instruments.

Further, the first terminals 20 and the second terminals 30, each making a pair, are provided in the connector 1. However, only either of the first terminals 20 and the second terminals 30 may be provided in the connector 1.

Further, in the above description, the first terminal 20 is brought into contact with the contact plate 71a, and the second terminal 30 is brought into contact with the contact plate 72a. However, the first terminal 20 may be brought into contact with the contact plate 72a, and the second terminal 30 may be brought into contact with the contact plate 71a.

We claim:

1. A connector, the connector comprising:
a first terminal, the first terminal being formed into a plate-spring shape and being arranged to extend in an insertion direction of an electronic component to be connected to the connector;
a second terminal, the second terminal being formed into a plate-spring shape; and
a housing, the housing having an insertion hole formed therein, the insertion hole being formed such that the electronic component can be inserted therein and accommodating the first terminal;
wherein:
the first terminal includes:
a first contact portion, the first contact portion being located on a course in the insertion hole through which the electronic component passes;
a first movable portion, the first movable portion including the first contact portion on a tip side thereof and extending from the first contact portion toward a side surface of the insertion hole, the side surface being spaced apart from the course; and
a first fixed portion, the first fixed portion being located on a base side of the first movable portion and restricted from moving;
the first movable portion is elastically deformable to incline toward the side surface of the insertion hole, employing the first fixed portion as a fixed point of inclining;
the first movable portion includes a hit portion between the first contact portion and the first fixed portion, the hit portion being located apart from the side surface of the insertion hole and being capable of hitting, midway during inclining of the first movable portion toward the side surface of the insertion hole, on the side surface of the insertion hole;
the second terminal is arranged to face the first terminal across the course;
the second terminal includes:
a second contact portion, the second contact portion being located on the course;
a second movable portion, the second movable portion including the second contact portion on a tip side thereof and extending from the second contact portion toward another side surface of the insertion hole; and
a second fixed portion, the second fixed portion being located on a base side of the second movable portion and restricted from moving;
the first contact portion and the second contact portion have a positional difference in the insertion direction of the electronic component;
the second contact portion being located at a deeper position in the insertion hole than that of the first contact portion;
the first contact portion and the second contact portion respectively include guide portions, the guide portions extending in an opposite direction to the insertion direction of the electronic component and inclining to expand an interval between them, the guide portion of the second contact portion having a inclination angle with respect to the insertion direction smaller than the inclination angle of the guide portion of the first contact portion with respect to the insertion direction.

2. The connector of claim 1, wherein the second movable portion further includes a second hit portion between the second contact portion and the second fixed portion, the second hit portion being located apart from the side surface of the insertion hole, and being capable of hitting, midway during inclining of the second movable portion toward the side surface of the insertion hole, against the side surface of the insertion hole.

3. A semiconductor testing device comprising the connector of claim 1, the semiconductor testing device comprising a circuit board on which the connector is mounted.

\* \* \* \* \*